Nov. 25, 1958 J. P. STELMAK ET AL 2,862,158

SEMICONDUCTOR DEVICE

Filed Oct. 22, 1954

WITNESSES:
E. A. McCloskey
C. F. Renz

INVENTORS
John P. Stelmak
and Raymond E. Brown.
BY
F. E. Browder
ATTORNEY

United States Patent Office 2,862,158

Patented Nov. 25, 1958

2,862,158

SEMICONDUCTOR DEVICE

John P. Stelmak, Horseheads, and Raymond E. Brown, Elmira, N. Y., assignors to Westinghouse Electric Corporation, East Pittsburgh, Pa., a corporation of Pennsylvania Application October 22, 1954, Serial No. 463,910

5 Claims. (Cl. 317—234)

This invention relates to improvements in semiconductor devices and to methods of manufacture of such devices.

This invention relates primarily to semiconductor devices known as junction transistors such as described in an article entitled "Operation of Junction Transistors" by A. Coblenz and H. L. Owens in the August 1953 issue of Electronics magazine.

It is an object of this invention to extend the use of junction transistors to power levels exceeding the present 150 milliwatts. The deleterious effects on transistors while operated under increased temperatures has emphasized the need for cooling of the semiconductor elements so as to increase the possible power dissipation of the device. It has been found in the use of germanium, one type of semiconductor material, that the temperature of the transistor wafer should not exceed 80° C.

It is accordingly an object of our invention to provide a semiconductor device having improved constructional features whereby efficient cooling is secured.

It is another object to provide a semiconductor device having simplified construction which is suitable for large-scale production.

It is another object to provide a semiconductor device in which the assembly procedure serves to decrease the shrinkage in manufacture.

These and other objects are effected by our invention as will be apparent from the following description taken in accordance with the accompanying drawing throughout which like reference characters indicate like parts, and in which.

Figure 2:
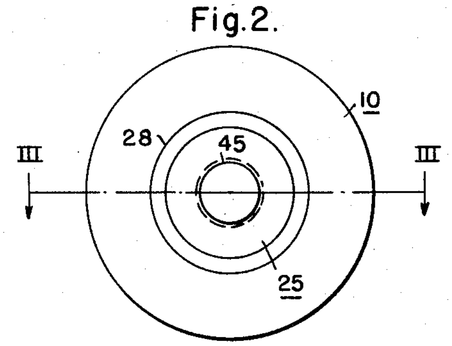
Fig. 2 is a view of the device taken along the line II—II of Fig. 1.
Figure 4:
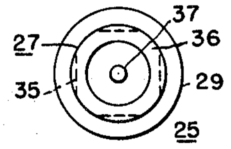
Fig. 4 is a bottom view of the semiconductor unit enclosed within the housing.

Referring to the drawings, the item 10 indicates the case or housing of the semiconductor device and is comprised of a tubular member 11 having integral fins 13 spaced along the outer periphery of the member 11. The housing 10 is of a suitable heat conductive material such as copper. The outer surface of the case 10 may be blackened in any suitable manner to aid in the radiation of heat from the case 10.

The first step in the assembly of the semiconductor device is the positioning of closure member 15 on the lower portion of the case 10 over the opening in the case 10. The closure member or header 15 is comprised of a button 16 of suitable insulating material, such as glass, having a metallic rim 17 of suitable material, such as Kovar, positioned around the periphery or edge or the button 16. The outer dimensions of the button 16 with the rim 17 attached is slightly less than the inner dimensions of the opening in the tubular member 10. In the specific device shown, an out-turned flange 18 is provided on the lower edge of the peripheral rim 17 so that when the member 15 is inserted into the opening of the housing 10, the flange 18 will abut against the lower portion of the tubular housing 10. Also provided within the button 16 are two tubular members 19 and 20 which extend through and are sealed therein and are of a suitable material, such as Kovar. The rim 17 of the closure member 15 is sealed to the housing 10 in any suitable manner and we have found it advisable to tin-plate the rim prior to the insertion into the housing and then soldering the two members 15 and 10 together so as to effect a hermetic seal between the closure member 15 and the case 10.

The opposite end of the housing 10 is closed by the insertion of a mounting assembly 25 which is comprised of a mounting block 26 with the semiconductor unit 27 attached thereto. The mounting block 26 is made of a suitable heat conductive material, such as copper, with a nickel coating thereon. The mounting block 26 may be broken down into three integral sections for purposes of explanation which includes a large section 29 which has a similar configuration as the opening within the case 10 and the outer dimensions of the section 29 are greater than the internal dimensions of the opening within the housing 10 by an amount of approximately .005 inch. A tapered section 30 is provided next within the mounting block 26 so that the larger section 29 is reduced to a smaller section 31 having a diameter of substantially one-third that of the internal diameter of the opening within the case 10. The semiconductor unit 27 is attached to the smaller section 31 of the mounting block 26 in suitable manner, such as soldering with indium.

The semiconductor unit 27 is comprised of a body or wafer 35 of semiconductive material such as germanium or silicon with suitable electrodes and which is known as a junction transistor. The body or wafer is comprised of zones or layers of different type conductivity material. The semiconductor unit 27 is described in the previously mentioned article and only a partial description will be given here for the purposes of explanation. The structure of the semiconductor unit may best be described by description of one method of construction. The method of construction of the semiconductor unit 27 will be described with reference to the use of a germanium type device and of a PNP type junction transistor. We do not wish to be limited to this type of semiconductive material nor to this type junction unit.

A wafer of N-type germanium having dimensions of approximately .160 by .160 inch and having a thickness of approximately .008 inch is obtained by procedure well known in the art and described in the previously mentioned article. The resistivity of the N-type germanium is of the order of 10 to 12 ohm centimeters. The term N-type germanium indicates that an impurity material added is such that the doped germanium conductivity is dependent on the excess electrons within the material which are obtained by the adding of a suitable impurity such as phosphorus or arsenic.

The term P-type germanium indicates that the material is of the type which depends on the conductivity due to excess holes within the material obtained by addition of an impurity such as indium or gallium. It is desirable that the N-type wafer be of a single crystal so that the material will be of high lifetime. The wafer as above described and after suitable etching of the surface, is ready for the process of manufacture into a PNP junction type transistor.

A suitable impurity of the P-type, such as indium, is formed into a pellet and in the case of the emitter electrode of the junction type transistor, has the dimensions of approximately .030 x .030 inch and .030 inch in thickness. A pellet is also provided for the collector zone of the semiconductor unit of a suitable P-type material such as indium and has the approximate dimensions .070 inch round and .030 inch in height. A base electrode 36 or connection is first connected to the wafer 35 and is comprised of a circular member in the form of a ring 36 having the approximate diameter of the wafer 35. The base ring 36 is soldered to the wafer 35 in a suitable manner using a lead-tin alloy so as to provide a good ohmic connection to the wafer 35. The PNP-junction transistor is next formed by any suitable process and the process described herein is known as the diffusion or alloy process. This process comprises the placing of the collector pellet on the surface of the wafer 35 opposite to that surface to which the base ring 36 is attached, and this assembly is then fired in a deoxidized hydrogen atmosphere at approximately 400° C. for approximately five minutes. After this, the wafer 35 is turned over and the emitter pellet is placed on substantially the center portion of the wafer 35 and the assembly is then fired at 530° C. for approximately 10 minutes in a similar hydrogen atmosphere. The unit is then cooled to room temperature at a suitable rate and the junction transistor is formed. The temperature of 530° C. is below the melting point of the germanium, but of sufficient temperature to melt the indium impurity utilized so that the indium penetrates into the surface of the wafer 35 converting the zone of penetration into a P-type zone. The portion or zone of the wafer between the two P-type zones remains N-type. The portion of the pellets remaining above the surface of the wafer 35 are substantially indium and serve as the electrodes or connections. These may be designated the emitter electrode 37 and the collector electrode 38. The semiconductor unit 27 is mounted to the mounting block 25 by the utilization of a small amount of indium solder and then heating the mounting block to sufficient temperature so that the collector electrode 38 of the transistor is attached to the mounting block 25.

A lead-in connection 40 of suitable material such as tinned copper and having a diameter of approximately .02 inch is attached to the base ring 36 in a suitable manner such as soldering. A lead-in 41 is also provided to the emitter electrode 37 of suitable material, such as tinned copper, having a diameter of substantially .013 inch and is attached thereto by any suitable manner such as soldering. The unit thus formed is cleaned and conditioned by etching (electrolytic).

Figures 1, 3, 5:
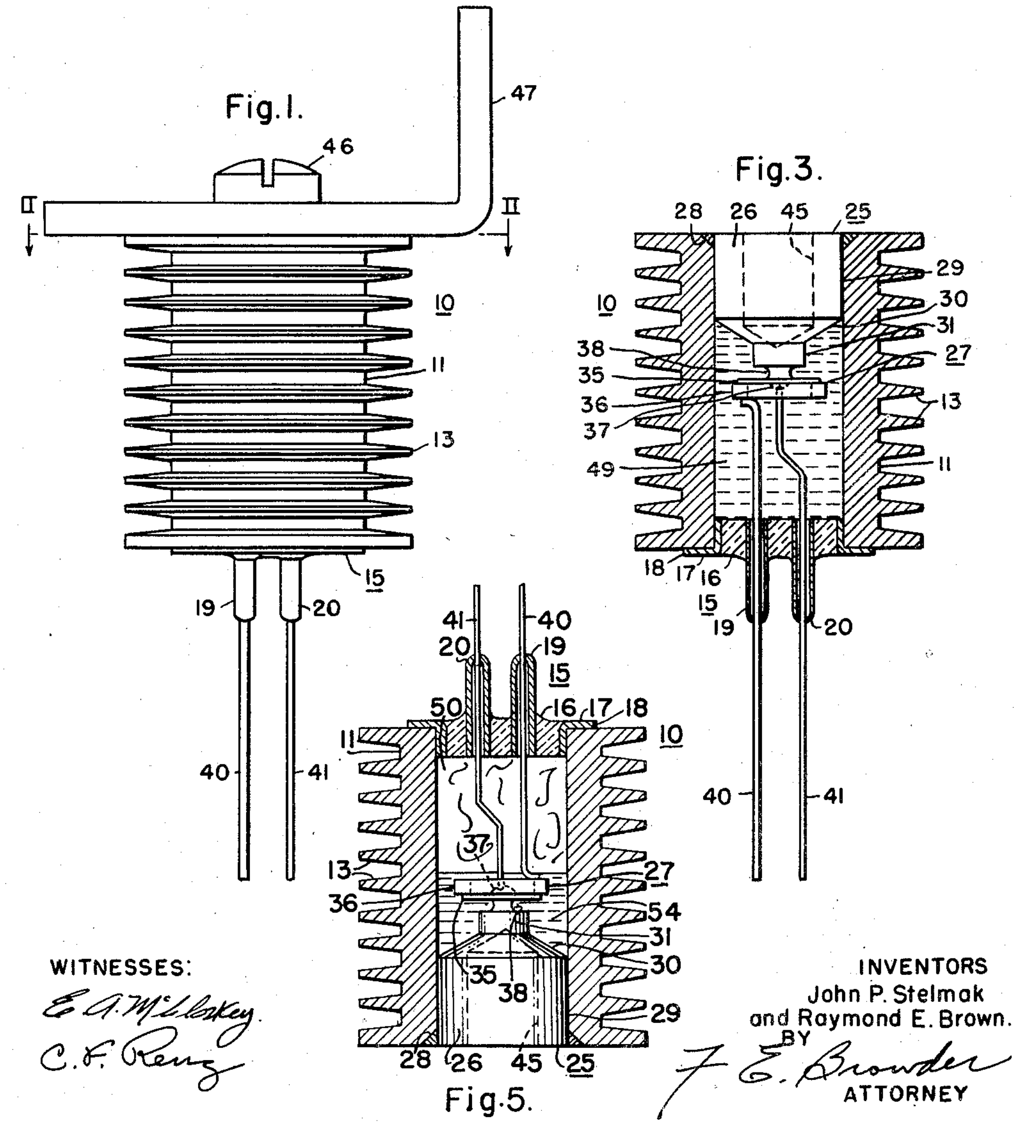
Figure 1 is an elevational view of a semiconductor device constructed in accordance with our invention.
Fig. 3 is a sectional view of the device taken along the line III—III of Fig. 2.
Fig. 5 is a sectional view of another form of this invention taken along the line III—III of Fig. 2.

The mounting assembly 25 with the emitter and base leads 41 and 40 attached is next inserted into the opening of the upper end of the case 10. The leads 40 and 41 are threaded through the respective tubular openings 19 and 20 in the closure member 15. Due to the fact that the upper section 29 of the mounting block 25 has external dimensions slightly greater than the internal dimensions of the opening of the case 10, it is necessary to drive the mounting assembly 25 into the opening of the case 10. In this manner the section 29 of mounting assembly 25 is press fitted into the case 10. This results in not only hermetically sealing the upper end of the opening in the housing 10, but also intimate contact between the mounting block 26 and the case 10 so that excellent heat conduction is provided therebetween. It may be advisable in some cases in order to dispense with the close tolerance requirements between the outer dimensions of the mounting base 25 and the inner dimensions of the opening of the case 10 to utilize a solder seal. This may be accomplished by providing a small depression 28 in the case 10 surrounding the upper opening as indicated in Fig. 3.

A threaded opening 45 is provided into the section 29 of the mounting base 25 and a suitable threaded screw 46 may be provided for attaching a connector lead (not shown) of the semiconductor device. We have also shown in Fig. 1 an L-shaped mounting support or bracket 47 which may be attached to the case 10 by the threaded screw 46. The bracket 47 may be of any suitable material such as aluminum and not only does this bracket 47 provide a means of support or mounting for the semiconductor device, but also provides a heat sink for the unit. The bracket 47 thereby further increases the power handling capabilities of the device. The tubular members 19 and 20 into which the respective lead-ins 40 and 41 are inserted also provide an opening for the insertion of a suitable cooling liquid 49 into the opening of the case 10. The cooling liquid 49, such as an organic fluorocarbon, is inserted by a hypodermic needle or other suitable means into one of the tubular members 19 or 20 while the other tubular member provides an air opening. The cooling liquid 49 which is inserted into the opening in the case 10 surrounds the entire semiconductor device 27, thereby providing enhanced cooling to the unit by the convection of heat from the PNP-junction unit itself. If a high boiling point liquid is utilized, such as one of the fluorocarbon fluids, it is desirable to fill the entire volume of the opening provided in the case 10. It is also possible to utilize a low boiling point liquid 54 and it would be necessary in this case to utilize approximately one-third of the volume and it also would be necessary to position the semiconductor unit so that the liquid would cover the semiconductor unit in the operating condition as shown in Fig. 5. The heat is conducted from the semiconductor to the housing by means of the vapor 50 of said low boiling point liquid 54.

After the cooling liquid 49 has been inserted into the opening in the case 10, the tubular members 19 and 20 about the lead-in members 40 and 41 are clamped so as to hermetically seal the tubular members 19 and 20 respectively around the lead-in connections 40 and 41. It is advisable to utilize solder in order to insure a good hermetic seal.

It should be stressed that in the structure and method of assembly of the unit described herein, it is important that any soldering operation not damage the crystal or the junctions. By the method of assembly as set out, the closure member 15 is soldered into the case 10 prior to the insertion of the semi-conductor unit 27. The soldering of the lead-in connections 40 and 41 to the tubular members 19 and 20 is provided after the cooling medium 49 is inserted into the opening of the case 10 so that no damage occurs to the semiconductor unit since the liquid 49 will convey the heat away from the unit.

In the operation of the device, most of the heat is generated at the collector junction or electrode 38 and the device as described herein attacks this problem specifically. The copper mounting block 25 is attached to the collector electrode 38 directly and is in intimate contact with the copper case 10 so that an excellent metallic conduction path to the transfer of the heat from the collector region is provided from the block 25 to the case 10. The heat is transferred from the metal case 10 by air convection. It is also seen that this unit's power handling capabilities may be increased by utilizing a forced cooling air stream or water on the case 10. The cooling liquid 49 which surrounds the semiconductor unit 27 provides additional heat transfer by convection in the high boiling point type liquids to the metal case 10 and from the metal case 10 by air convection. Since all surfaces of the semiconducting element and electrodes are in intimate contact with the heat dissipation of liquid medium, the utilization of the liquid 49 within the housing 10 gives additional protection where pulses of energy cause quick heat rises within the semiconductor unit 27. It also may be desirable in some cases to utilize an inert resin or other low loss medium within the opening in place of the liquid 49 previously described.

While we have shown our invention in only one form, it will be obvious to those skilled in the art that it is not so limited, but is susceptible of various other changes and modifications without departing from the spirit and scope thereof.

We claim as our invention:

1. A semiconductive device comprising a metallic tubular housing having radiating fins thereon, a semiconductive unit located within the interior of said housing, said unit comprising a body of semi-conductive material having a pair of outer zones of one conductivity type on opposite sides and forming p-n junctions with an intermediate zone of the opposite conductivity, lead-in connection to said intermediate zone and one of said outer zones, means for positioning said semiconductive elements within said housing comprising a metallic member of high heat conductivity attached to the other of said outer zones, said member of suitable dimensions so as to be capable of being press fitted into the end of said housing, said lead-in connections to said outer zone and said intermediate zone brought out the opposite end of said housing through a closure member, said closure member comprising a button of insulating material having metallic rim and tubular sleeves embedded within the button so that said lead-in connections may be brought to the exterior of said housing through said closure member.

2. A semiconductor device comprising a tubular housing, a semiconductor unit positioned within the interior of said housing, said semiconductor unit comprising at least a base electrode, a collector electrode and an emitter electrode, said collector electrode of said semiconductor unit mounted to a heat conductive member which is press fitted into one end of the opening of said tubular housing, lead-in connections from said base electrode and said emitter electrode brought out the opposite end of said housing with respect to said heat conductive member, liquid cooling means within said housing and surrounding said semiconductor unit, and a closure member at the opposite end of said housing so as to hermetically seal the semiconductor unit within said housing.

3. In the method of manufacture of a semiconductor device in which the semiconductor device comprises a junction transistor including at least a collector, emitter and base electrodes which is enclosed within a tubular heat conductive housing containing a liquid cooling medium surrounding the junction transistor, the steps comprising: sealing a glass metal header having tubular members provided therein for lead-in connections to the emitter and base electrodes of said transistor, mounting a heat conductive member to said collector electrode and press fitting said member within said housing, injecting cooling liquid into said housing through one of said sleeves in said glass metal header, and sealing said sleeves around said lead-ins so as to hermetically seal said transistor unit within said housing.

4. A semiconductor device comprising a semiconductor unit hermetically sealed within the interior of a heat conductive housing, said housing having a plurality of fins thereon, said semiconductor unit comprising at least a collector electrode, said semiconductor unit positioned within said housing by a heat conductive member soldered to said collector electrode and press fitted within said housing, and a low boiling point liquid within said housing and substantially surrounding said semi-conductor unit for conducting heat from said collector electrode by means of the vapor of said low boiling point liquid to said housing.

5. A semiconductive device comprising a metallic tubular housing, a semiconductive unit located within the interior of said housing, said unit comprising a body of semiconductive material having a pair of outer zones of one conductivity type on opposite sides and forming p-n junctions with an intermediate zone of the opposite conductivity type, lead-in connection to said intermediate zone and one of said outer zones, means for positioning said semiconductive elements within said housing comprising a metallic member of high heat conductivity attached to the other of said outer zones, said member of suitable dimensions so as to be capable of being press fitted into the end of said housing, said lead-in connections to said outer zone and said intermediate zone brought out the opposite end of said housing through a closure member, said closure member comprising a button of insulating material having metallic rim and tubular sleeves embedded within the button so that said lead-in connections may be brought to the exterior of said housing through said closure member.

References Cited in the file of this patent

UNITED STATES PATENTS

| | | |
|---|---|---|
| 2,603,692 | Scaff et al. | July 15, 1952 |
| 2,725,505 | Webster et al. | Nov. 29, 1955 |
| 2,787,744 | Brock et al. | Apr. 2, 1957 |